United States Patent [19]

Abe

[11] Patent Number: 5,050,080

[45] Date of Patent: Sep. 17, 1991

[54] DIAGNOSTIC SYSTEM FOR A MOTOR VEHICLE

[75] Inventor: Kunihiro Abe, Higashimurayama, Japan

[73] Assignee: Fuji Jukogyo Kabushiki Kaisha, Tokyo, Japan

[21] Appl. No.: 411,553

[22] Filed: Sep. 22, 1989

[30] Foreign Application Priority Data

Sep. 28, 1988 [JP] Japan .................... 63-243669

[51] Int. Cl.$^5$ ............................ G01M 15/00
[52] U.S. Cl. ................... 364/424.04; 364/431.01; 364/431.12; 73/117.2
[58] Field of Search ............ 364/424.03, 424.04, 364/431.01, 431.04, 431.11, 431.12, 550, 551.01; 73/117.2, 117.3; 340/438, 459

[56] References Cited

U.S. PATENT DOCUMENTS

| | | | |
|---|---|---|---|
| 4,694,408 | 9/1987 | Zaleski | 364/431.01 |
| 4,839,811 | 6/1989 | Kanegae et al. | 364/431.01 |
| 4,843,557 | 6/1989 | Ina et al. | 364/431.11 |
| 4,853,850 | 8/1989 | Krass, Jr. et al. | 364/424.03 |
| 4,862,371 | 8/1989 | Maekawa | 73/117.2 |
| 4,894,781 | 1/1990 | Sato et al. | 364/431.11 |
| 4,910,678 | 3/1990 | Kubozono et al. | 340/438 |
| 4,924,391 | 5/1990 | Hirano et al. | 364/551.01 |
| 4,924,398 | 5/1990 | Fujiwara | 73/117.2 |
| 4,926,330 | 5/1990 | Abe et al. | 73/117.2 |

FOREIGN PATENT DOCUMENTS 58-12848 1/1983 Japan .
59-61740 4/1984 Japan .

*Primary Examiner*—Gary Chin
*Attorney, Agent, or Firm*—Martin A. Farber

[57] ABSTRACT

A diagnostic system for diagnosing an electronic control system of a vehicle wherein the electronic control system has a first memory for storing data. The diagnostic system has a diagnostic device having a second memory storing diagnosis programs for diagnosing the electronic control system. A third memory provided in the electronic control system stores specific information necessary for diagnosing the electronic control system. The diagnostic device obtains the specific information from the electronic control system and diagnoses the electronic control system in accordance with the diagnosis programs based on the specific information.

6 Claims, 6 Drawing Sheets

DIAGNOSTIC SYSTEM FOR A MOTOR VEHICLE

BACKGROUND OF THE INVENTION

The present invention relates to a diagnostic system for a motor vehicle.

Recently, a motor vehicle has been equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. If malfunctions of components and sensors occur, the engine does not properly operate.

However, because of complexity of the electronic control system, it is difficult to immediately find out the trouble. Accordingly, a diagnostic device for easily checking the electronic control system should be provided in an auto shop.

Japanese Patent Application Laid Open 59-61740 discloses a diagnostic system where signaling lamps provided on the vehicle are lighted or flashed when abnormalities occur in sensors and actuators such as injectors. However, the actual conditions of the defective sensors and actuators cannot be represented by the lamps.

Japanese Patent Application Laid-Open 58-12848 discloses a diagnostic system in which an exclusive checking device is provided for measuring the pulse duration of fuel injection and engine speed, and for checking whether the idling speed is normal. The checking device is provided for diagnosing only a designated specific type of a motor vehicle.

FIG. 5 shows a recently proposed diagnostic system which comprises a diagnostic device 102 and one of several memory cartridges 103 detachably attached to the device 102. The memory cartridge 103 has a memory such as a ROM for storing diagnosis programs and fixed data for the type and the model year of a motor vehicle 100. The various cartridges 103 for all vehicle types and models are provided and a cartridge for the presented vehicle is selected and attached to the diagnosis device 102. Two-way communication between the cartridge 103 and an electronic control unit 101 on the vehicle 100 is performed for diagnosing the electronic control unit 101. Thus, various types of vehicles can be diagnosed by the diagnostic device The electronic control unit 101 has a self-diagnosis function to store trouble data in a memory when troubles occur in equipment such as sensors and actuators.

However, addresses for storing the trouble data in the memory and the conversion rate for converting data to physical values differ with different types and models of vehicles.

Additionally, if the electronic control unit 101 is improved without changing the model of the vehicle, or the diagnosis program is changed in accordance with the improvement, or diagnosis items increase due to the addition of sensors and actuators, the addresses for storing data and conversion rate may be changed. Thus, a diagnostician must consult a manual to find a corresponding cartridge for the particular diagnosis program and vehicle type. Consequently, a considerable time must be spent for the diagnosis. Furthermore, a plurality of cartridges must be provided for every vehicle type and model, resulting in an increase in the cost.

SUMMARY OF THE INVENTION

The object of the present invention is to provide a diagnostic system, wherein a program for diagnosing an engine of a vehicle can be executed without changing the program with the vehicle type or model to be diagnosed.

According to the present invention, there is provided a diagnostic system for diagnosing an electronic control system of an automotive engine mounted on a motor vehicle, the electronic control system having sensing means for detecting operating conditions of the motor vehicle and first memory means for storing data from or derived from the sensing means, and the diagnostic system having a diagnostic device having a control unit having second memory means storing diagnosis programs for diagnosing the electronic control system, a display for displaying diagnosis data, a keyboard for inputting a diagnosis mode into the control unit, and connecting means for connecting the diagnostic device with said electronic control system.

The system comprises third memory means provided in the electronic control system and storing address numbers of data necessary for diagnosing the electronic control system, fourth memory means provided in the diagnostic device for storing character information transmitted from the electronic control system. The character information includes addresses of the first memory means storing the data. This enables immediate and accurate read out of the data from the first memory means by designating one of the address numbers corresponding to the data. The character information may also include conversion rate for converting data to a physical value.

The other objects and features of this invention will become understood from the following description with reference to the accompanying drawings.

DETAILED DESCRIPTION OF THE PREFERRED EMBODIMENT

Figure 1:
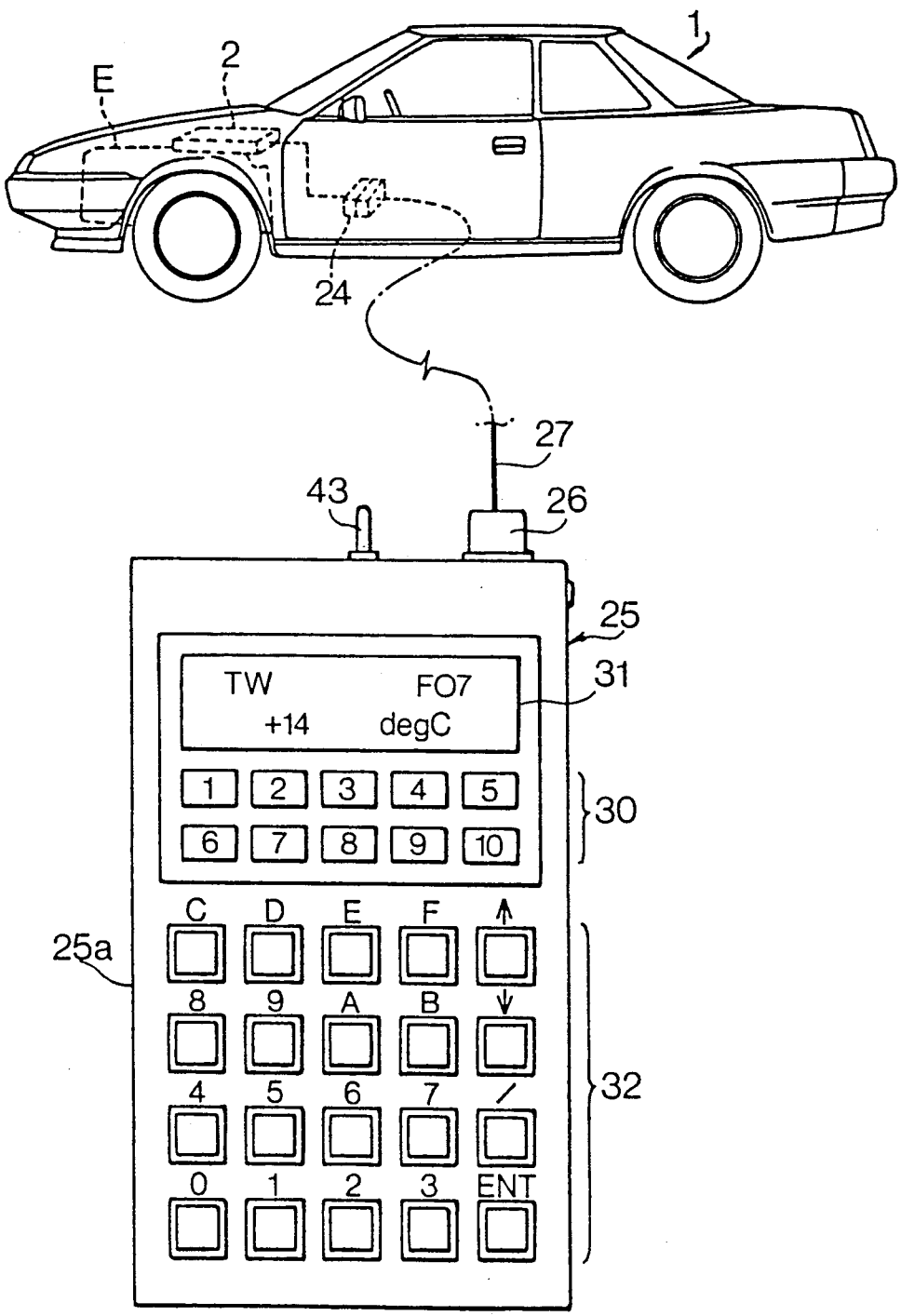
FIG. 1 is a schematic illustration of a diagnostic system according to the present invention.
Figure 2A:
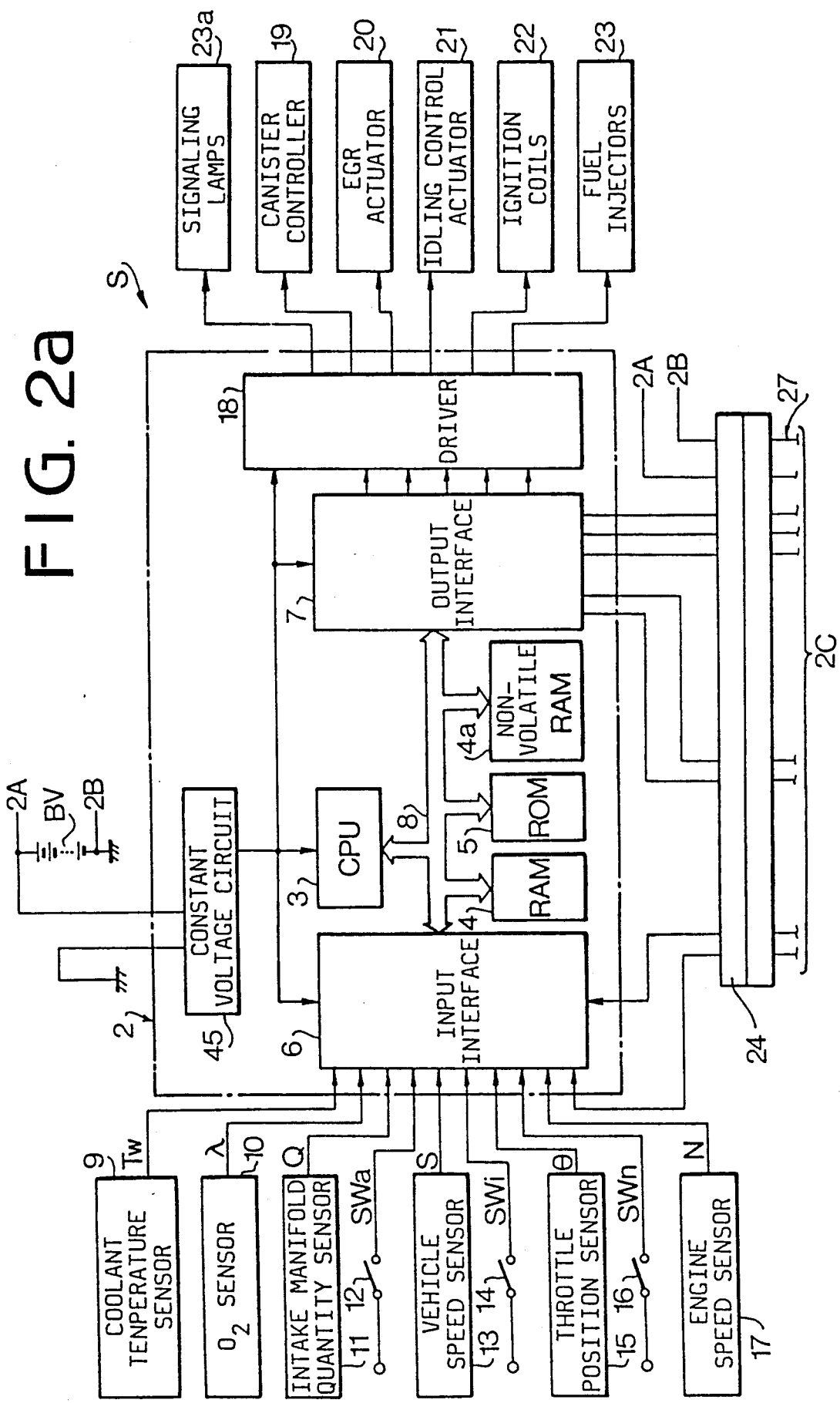
FIGS. 2a and 2b show a block diagram of the system.

Referring to FIGS. 1 and 2a, an automobile 1 is equipped with an electronic control system S comprising an electronic control unit 2, a plurality of sensors and switches (herein called sensing means), and a plurality of actuators for controlling various components of an engine E, a transmission, a suspension and other systems. The electronic control unit 2 is connected to an external connector 24. A portable diagnostic device 25 comprising a microcomputer is housed in a case 25a and has a connector 26, to which the connector 24 of the unit 2 is connected through an adapter harness 27.

The diagnostic device 25 has a power switch 43, a liquid crystal display 31, an indicator section 30 consisting of a plurality of indicators of LED, and a keyboard 32.

Figure 2B:
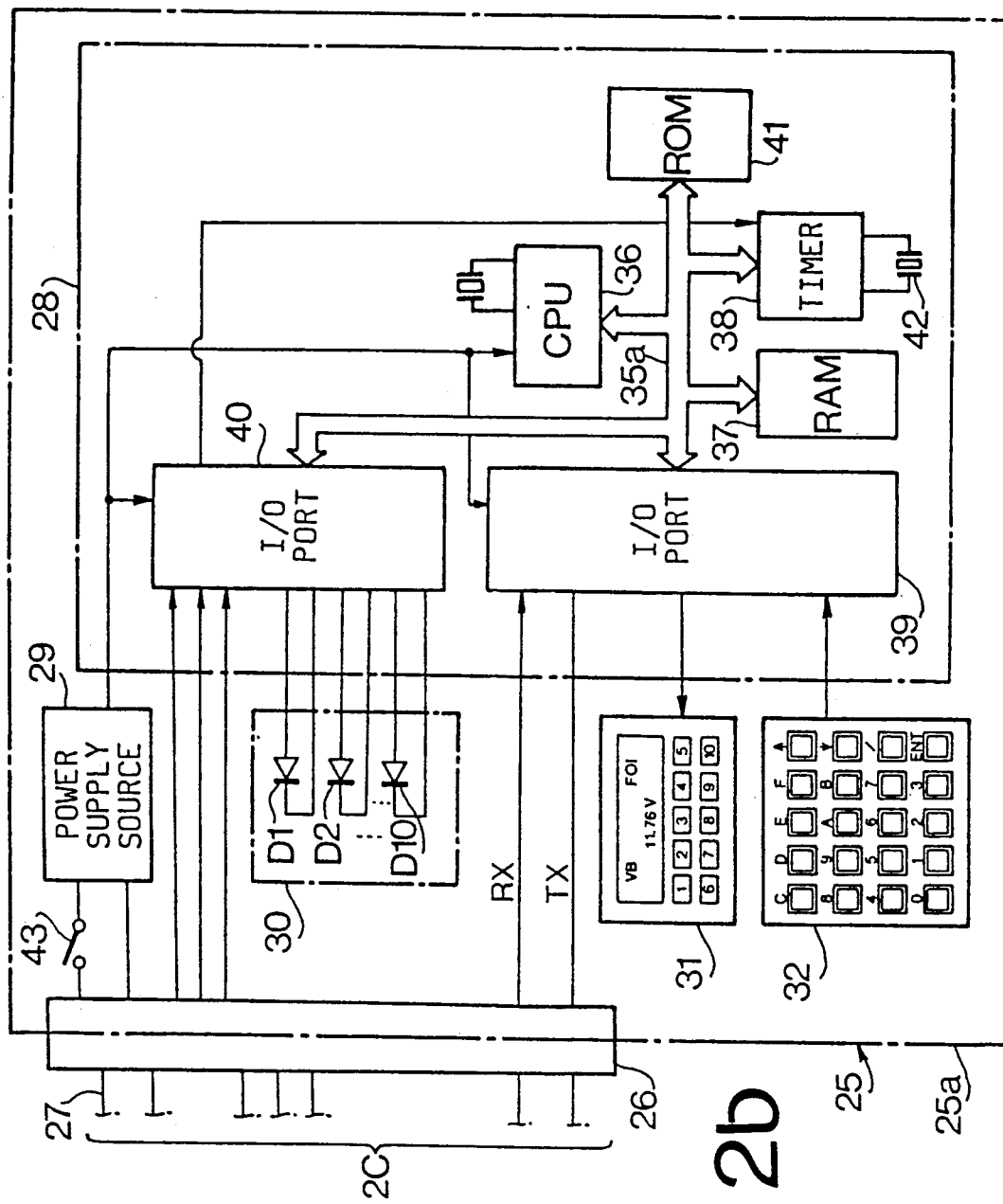

Referring to FIGS. 2a and 2b, the electronic control unit 2 comprises a central processor unit (CPU) 3, a random access memory (RAM) 4, a read only memory (ROM) 5, a nonvolatile random access memory (nonvolatile RAM) 4a, an input interface 6 and an output interface 7. The CPU 3, RAM 4, RAM 4a, ROM 5, and the input and output interfaces 6 and 7 are connected to each other through a bus line 8. Programs and data for controlling the engine E are stored in the ROM 5. Power is supplied to the CPU 3, the input and output interfaces 6 and 7, and a driver 18 from a source BV through a constant voltage circuit 45.

The input interface 6 is applied with a coolant temperature signal Tw from a coolant temperature sensor 9, an air-fuel ratio feedback signal λ from an $O_2$ sensor 10, an intake-air quantity signal Q from an intake manifold quantity sensor 11, an air conditioner operating signal SWa from an air conditioner switch 12, a vehicle speed signal S from a vehicle speed sensor 13, an idling signal SWi from an idle switch 14, a throttle valve opening degree signal θ from a throttle position sensor 15, a neutral positioning signal SWn from a neutral switch 16 in a transmission and an engine speed signal N from an engine speed sensor 17. These signals are stored in the RAM 4 after processing data in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system) actuator 20, an idling control actuator 21, ignition coils 22 and fuel injectors 23.

The driver 18 further applies signals to signaling lamps 23a. The signaling lamps 23a are provided in the electronic control unit 2 for indicating an abnormality in the unit 2. The unit 2 has a self-diagnosis function for diagnosing the condition of the equipment such as the sensors and the actuators. When an abnormality is detected in the unit 2 by the self-diagnosis function, a corresponding trouble code is read out from the ROM 5 so as to turn on or flash a plurality of the lamps 23a, thereby indicating the trouble code. The trouble data of the detected abnormality is stored in the RAM 4a.

The ROM 5 further stores character or specific information of various data such as an address of data stored in the RAM 4, conversion rate for converting diagnosis data to a physical value, abbreviations and units of the sensors, the addresses of table data stored in the RAM 4a and a code converting table for the trouble data.

The diagnostic device 25 has a control unit 28 and a power supply source 29. The control unit 28 comprises a CPU 36, a RAM 37, input/output (I/O) ports 39 and 40, a timer 38, and a ROM 41. These elements are connected to each other through a bus line 35a. A clock pulse generator 42 is provided for generating synchronizing pulses. The ROM 41 stores general-purpose programs which are capable of diagnosing the control systems of all types of motor vehicles regardless of the composition of the diagnosis system to be used. Inputs of the I/O port 40 are connected to the output interface 7 of the control unit 2 through the connectors 24 and 26 and the harness 27 so as to receive output signals of the sensors and switches 9 to 17. Outputs of the port 40 are connected to an indicator section 30. Inputs of the I/O port 39 are connected to the keyboard 32 for being applied with a mode select signal dependent on the operation of the keyboard 32, and to the output interface 7. Outputs of the port 39 are connected to the input interface 6 and the display 31. The power source 29 for supplying the power to the CPU 36 and I/O ports 39 and 40 is connected to the source BV through the power switch 43.

Before executing the diagnosis program, the control unit 2 is connected to the diagnostic device 25 through the harness 27.

The operation of the system is described hereinafter with reference to the flowcharts of FIGS. 3a, 3b and 4. The engine is started, and the following diagnosis program is executed under the running condition of the engine.

The power switch 43 is turned on and a preliminary program for recognizing the specific information stored in the ROM 5 starts.

Figure 3:
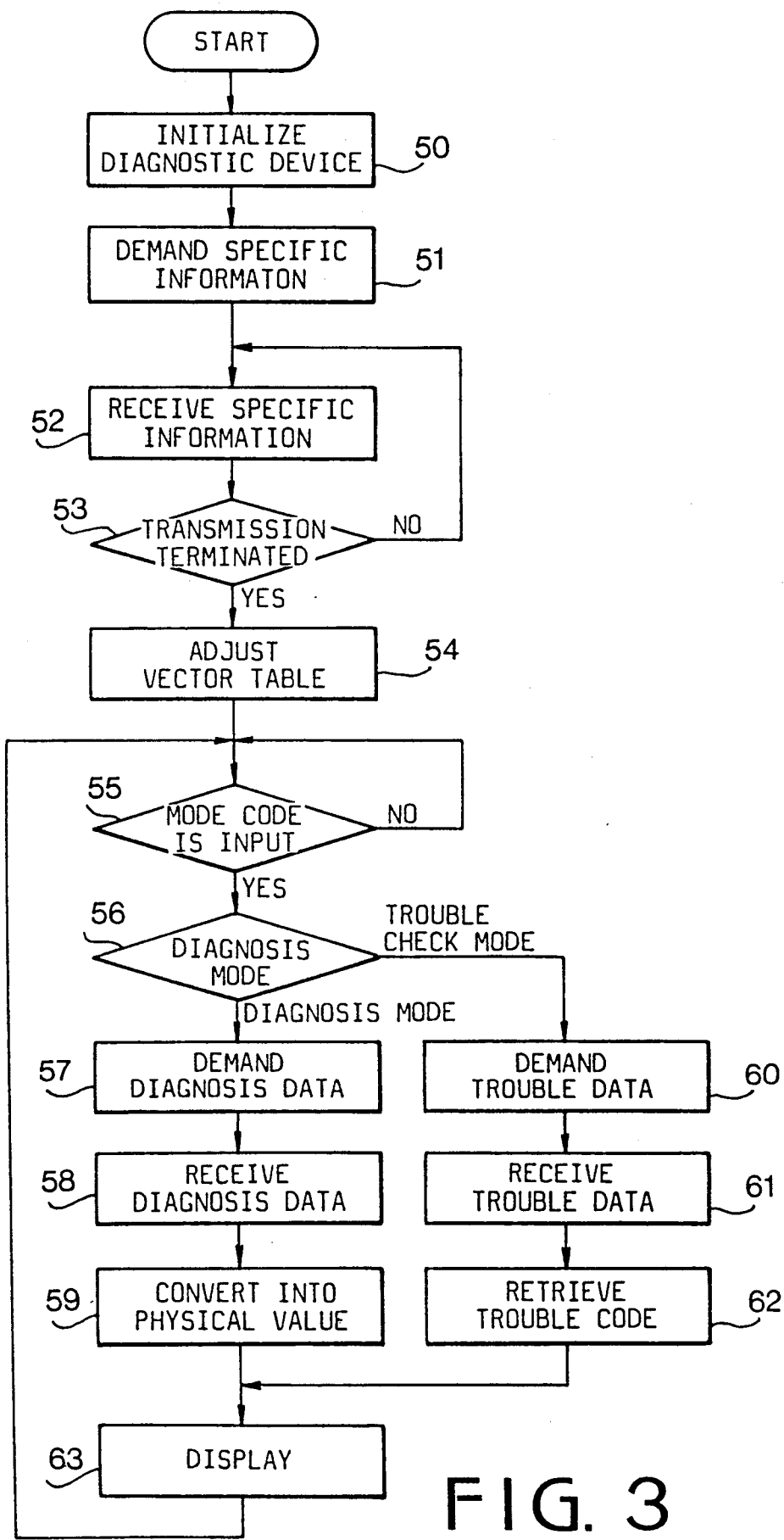
FIG. 3 is a flowchart showing an operation of the system.

Referring to FIG. 3, at a step 50, the diagnostic device 25 is initialized. At a step 51, a demand signal demanding the specific information is sent to the electronic control unit 2. Thus, the specific information stored in the ROM 5 is transmitted to the control unit 28 and stored at a predetermined address in the RAM 37 at a step 52. At a step 53, it is determined whether the transmission of the specific information is terminated. If it is not, the program returns to the step 52 to continue the transmission. The program goes to a step 54 when the transmission has terminated.

At the step 54, an interrupt vector table is adjusted and the diagnosis program stored in the ROM 41 is executed thereafter. At a step 55, it is determined whether a mode code is input through the keyboard 32. When the code is not input, the loop is repeated at the step 55.

At a step 56, the input mode code is interpreted and determined whether the selected mode is a diagnosis mode or a trouble check mode.

In the diagnosis mode, for example, when checking the coolant temperature, a mode code F07 for coolant temperature checking item (for example F→0→7→ENT) is input by operating the keyboard 32. The mode code is read out by the CPU 36 of the control unit 28.

The data demand signal TX depending on the address, according to the specific information, stored in the RAM 37 is applied to the control unit 2 at a step 57. At a step 58, a diagnosis data signal RX representing the coolant temperature stored in the corresponding address is applied to the control unit 28 from the control unit 2. At a step 59, the received binary digit is converted into a decimal digit representing the coolant temperature in accordance with the conversion rate, stored in the RAM 37. The abbreviation and the units of the coolant temperature are read out from the RAM 37 and applied together with the decimal digit to the display 31. Accordingly, the abbreviation TW, the mode code F07, the temperature +14 and the units deg C of the coolant temperature are displayed on the display 31 as shown in FIG. 1 at a step 63. The program returns to the step 55 for the next diagnosis.

When the keyboard 32 is operated to select a trouble check mode, it is determined that the selected mode is the trouble check mode at step 56 so that the program goes to a step 60.

A trouble data demand signal representing a trouble data storing address, according to the specific information, stored in the RAM 37 is applied to the control unit 2 at the step 60. Trouble data, stored at a corresponding storing address of the nonvolatile RAM 4a is read out and a signal representing the trouble data is transmitted to the control unit 28 (step 61). At a step 62, the trouble code and abbreviation of a defective sensor or actuator corresponding to the trouble data are retrieved from the code converting table stored in the RAM 37. Thereafter the program goes to the step 63 where the trouble code and the abbreviation are displayed on the display 31. The program returns to the step 55 for the next diagnosis.

Figure 4:
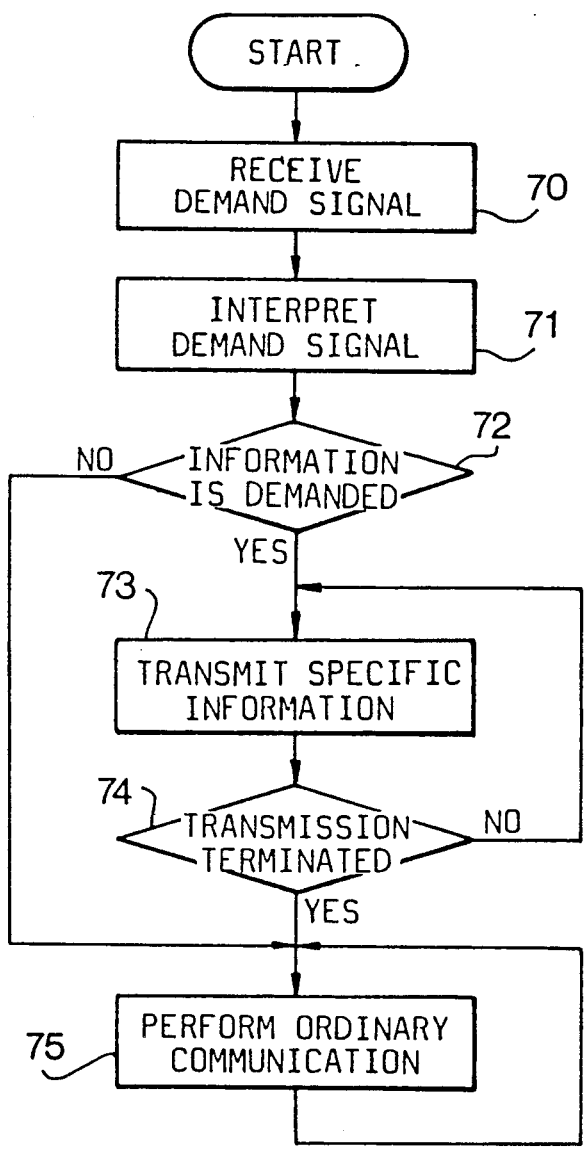
FIG. 4 is a flowchart showing an operation of a preliminary program for transmitting character information to a diagnostic device.
Figure 5:
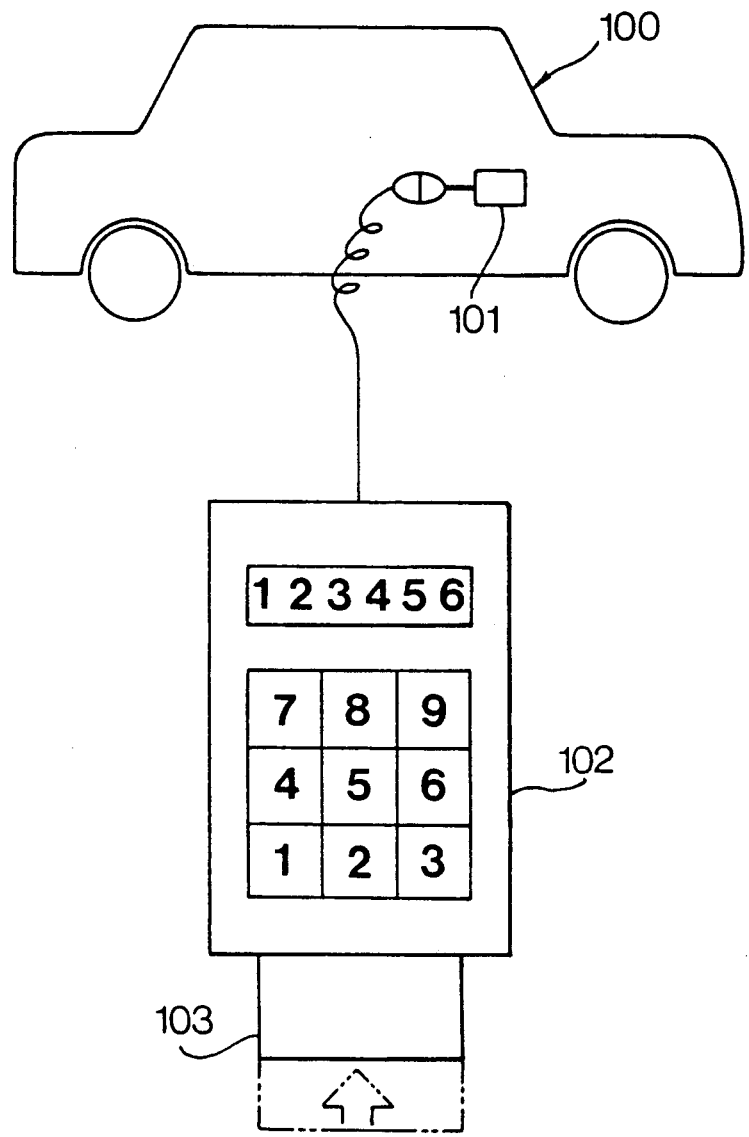
FIG. 5 is schematic illustration of a conventional diagnostic system.

Referring to FIG. 4 showing an operation of the control unit 2 during the preliminary program, at a step 70, a demand signal is applied from the diagnostic device 25 and at a step 71, the demand signal TX is interpreted. At a step 72, it is determined whether the demand signal is an information demand signal for demanding the specific information stored in the ROM 5. If the answer is YES, the program goes to a step 73 where the specific information stored at the predetermined address of the ROM 5 is retrieved and transmitted to the diagnostic device 25 through the output interface 7.

At a step 74, it is determined whether the transmission of the specific information is terminated. If it is not, the program returns to the step 73 to continue the transmission. If the transmission has terminated, the program goes to a step 75 where ordinary communication between the diagnostic device 25 and the control unit 2 is performed so as to execute the diagnosis program stored in the diagnostic device 25. When it is determined at the step 72 that the demand signal is not the information demand signal, the program proceeds directly to the step 75.

Since only the specific information is transmitted from the control unit 2 to the diagnostic device 25, the transmission time is short. Accordingly, the diagnosis program can be carried out immediately after the diagnostic device 25 is connected to the control unit 2 of the vehicle.

From the foregoing, it will be understood that the present invention provides a diagnostic system which may diagnose various types of vehicles and electronic control systems without changing the diagnosis program.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. In a diagnostic system for diagnosing an electronic control system of a motor vehicle, said electronic control system having sensing means for sensing operating conditions of said motor vehicle, control means for processing sensor data from said sensing means so as to calculate control data for controlling said vehicle, said first memory means for storing said sensor data and said control data, the diagnostic system having a diagnostic device and connecting means for connecting said diagnostic device with said electronic control system, said diagnostic device including a keyboard, a control unit for communicating with said electronic control system through said connecting means to read out said sensor data and said control data from said first memory means in response to a diagnosis mode inputted through said keyboard in accordance with programs stored in second memory means, and a display for displaying said sensor data and said control data read out by said control unit, the improvement in the diagnostic and electronic control systems which comprises:

third memory means provided in said electronic control system for storing address numbers of said first memory means storing said sensor data and said control data respectively; and fourth memory means provided in said control unit of said diagnostic device, upon demand of transmission of said address numbers from said electronic control system, for storing said address numbers in said control unit when said diagnostic device is initialized, so as to enable immediate and accurate read out of said sensor data and said control data from said first memory means by designating one of said address numbers corresponding to said sensor data and said control data.

2. The system according to claim 1, wherein
said third memory means further stores a conversion rate for converting said sensor data to a physical value by said control unit in order to display said sensor data on said display.

3. The system according to claim 2, wherein
said third memory further stores an abbreviation and units for said sensor data for displaying said sensor data on said display.

4. The system according to claim 2, wherein
said control unit demands said transmission of said address numbers when a power switch of said control unit is turned on.

5. The system according to claim 1, wherein
said third memory means is a read only memory.

6. The system according to claim 1, wherein
said keyboard constitutes means for inputting a code representing designation of said one of said address numbers, and said control unit for sending a corresponding data demand signal corresponding to said code to said first memory means for said read out of corresponding of said sensor and control data and for storing said corresponding sensor and control data in said fourth memory means of said control unit.

* * * * *